United States Patent
Li et al.

(10) Patent No.: US 9,532,485 B2
(45) Date of Patent: Dec. 27, 2016

(54) HEAT DISSIPATING DEVICE AND ELECTRONIC APPARATUS

(71) Applicant: Lenovo (Beijing) Co., Ltd., Beijing (CN)

(72) Inventors: Jinyu Li, Beijing (CN); Ziran Li, Beijing (CN); Chunfeng Yuan, Beijing (CN); Yingfeng Ma, Beijing (CN)

(73) Assignee: LENOVO (BEIJING) CO., LTD., Haidian District, Beijing (CN)

( * ) Notice: Subject to any disclaimer, the term of this patent is extended or adjusted under 35 U.S.C. 154(b) by 210 days.

(21) Appl. No.: 14/495,117

(22) Filed: Sep. 24, 2014

(65) Prior Publication Data

US 2015/0245536 A1   Aug. 27, 2015

(30) Foreign Application Priority Data

Feb. 21, 2014 (CN) .......................... 2014 1 0060514
Feb. 28, 2014 (CN) .......................... 2014 1 0073619
Mar. 3, 2014 (CN) .......................... 2014 1 0074834

(51) Int. Cl.
| | |
|---|---|
| *H05K 7/20* | (2006.01) |
| *H04M 1/02* | (2006.01) |
| *F04B 45/04* | (2006.01) |
| *G06F 1/20* | (2006.01) |
| *F04B 39/06* | (2006.01) |

(Continued)

(52) U.S. Cl.
CPC ........... *H05K 7/20145* (2013.01); *F04B 39/06* (2013.01); *F04B 43/046* (2013.01); *F04B 45/04* (2013.01); *F04B 45/047* (2013.01); *G06F 1/203* (2013.01); *H04M 1/02* (2013.01); *H05K 7/20154* (2013.01); *H05K 7/20163* (2013.01); *H05K 7/20172* (2013.01)

(58) Field of Classification Search
CPC ... H05K 7/20145; H05K 7/2029; F04B 45/04;
G06F 1/203; H01L 23/427; H01L 23/36;
H01L 23/367; H01L 23/3672; F28F 13/00
USPC ...... 361/700, 679.47, 679.52; 165/804–80.5,
165/104.33
See application file for complete search history.

(56) References Cited

U.S. PATENT DOCUMENTS 7,298,620 B2 * 11/2007 Wu ..................... F28D 15/0275
165/80.4
7,669,642 B1 * 3/2010 Tsai ....................... H01L 23/427
165/104.33

(Continued)

*Primary Examiner* — David M Sinclair
*Assistant Examiner* — Robert Brown
(74) *Attorney, Agent, or Firm* — Brinks Gilson & Lione; G. Peter Nichols

(57) ABSTRACT

A heat dissipating device located on a same base plate with a fan, and a first side of the heat dissipating device abutting an air outlet of the fan. The heat dissipating device includes a plurality of horizontal heat dissipating fins horizontally arranged in parallel with each other in a stacked manner such that arrangement of the plurality of horizontal heat dissipating fins is consistent with a direction of the air outlet of the fan, wherein two adjacent horizontal heat dissipating fins have a gap there between, through which air from the air outlet of the fan is discharged, wherein, a first horizontal heat dissipating fin located at an uppermost layer is coupled with a heat pipe and the heat pipe is coupled with at least one heating element. The heat dissipating device is capable of enhancing heat dissipating efficiency and improving the user's usage experience.

20 Claims, 8 Drawing Sheets

(51) Int. Cl.
*F04B 43/04* (2006.01)
*F04B 45/047* (2006.01)

(56) References Cited

U.S. PATENT DOCUMENTS

| | | | | |
|---|---|---|---|---|
| 2004/0000392 A1* | 1/2004 | Chen | F28F 13/00 | 165/80.3 |
| 2004/0246677 A1* | 12/2004 | Chen | G06F 1/20 | 361/697 |
| 2006/0032616 A1* | 2/2006 | Yang | H01L 23/427 | 165/104.33 |
| 2006/0144575 A1* | 7/2006 | Chu | F28F 3/025 | 165/133 |
| 2007/0234740 A1* | 10/2007 | Lee | G06F 1/20 | 62/3.2 |
| 2007/0234741 A1* | 10/2007 | Lee | G06F 1/20 | 62/3.2 |
| 2007/0254584 A1* | 11/2007 | Chang | H01L 23/3672 | 454/233 |
| 2009/0129020 A1* | 5/2009 | Fujiwara | G06F 1/203 | 361/697 |
| 2010/0025012 A1* | 2/2010 | Wu | H01L 23/3672 | 165/80.3 |
| 2010/0078154 A1* | 4/2010 | Li | F28D 15/0275 | 165/104.31 |
| 2010/0101756 A1* | 4/2010 | Chu | F28D 15/0275 | 165/80.3 |
| 2010/0101757 A1* | 4/2010 | Xu | H01L 23/3672 | 165/80.3 |
| 2010/0128436 A1* | 5/2010 | Edmunds | H01L 23/427 | 361/700 |
| 2010/0150753 A1* | 6/2010 | Busch | F04B 43/04 | 417/413.1 |
| 2011/0000649 A1* | 1/2011 | Joshi | H01L 23/427 | 165/104.26 |
| 2011/0128703 A1* | 6/2011 | Fujihara | G06F 1/20 | 361/697 |
| 2011/0249382 A1* | 10/2011 | Tsubota | H05K 7/1414 | 361/679.01 |
| 2012/0217630 A1* | 8/2012 | Kodani | H01L 23/367 | 257/706 |
| 2012/0241136 A1* | 9/2012 | Zeng | G06F 1/20 | 165/121 |
| 2013/0258585 A1* | 10/2013 | Tanner | F28F 1/40 | 361/679.52 |
| 2013/0309107 A1* | 11/2013 | Chen | F04B 45/047 | 417/410.1 |
| 2014/0177164 A1* | 6/2014 | Stewart | H05K 7/20145 | 361/679.46 |
| 2015/0103490 A1* | 4/2015 | Lee | H05K 7/2079 | 361/695 |
| 2015/0124397 A1* | 5/2015 | Dean | G06F 1/20 | 361/679.46 |
| 2015/0264834 A1* | 9/2015 | Ellis | H05K 1/144 | 361/690 |
| 2015/0271957 A1* | 9/2015 | Pal | H05K 7/20945 | 361/678 |

* cited by examiner

HEAT DISSIPATING DEVICE AND ELECTRONIC APPARATUS

This application claims priority to Chinese patent application No. 201410060514.6 filed on Feb. 21, 2014; Chinese patent application No. 201410074834.7 filed on Mar. 3, 2014; and Chinese patent application No. 201410073619.5 filed on Feb. 28, 2014, the entire contents of which are incorporated herein by reference.

BACKGROUND

The present application relates to a heat dissipating device, and more particularly, to a heat dissipating device and an electronic apparatus using a vibrating diaphragm fan.

With constant improvement in performance and power consumption of electronic products, heat generated thereby is also increasing. However, as for a product with very limited space, because a fan cannot be installed inside the product, heat dissipating can only be performed in ways of heat dissipation and natural convection. However, since a heat dissipating capacity of the product is limited by a size of a surface area of the product, which results in limitation to a total power consumption of the product, only a chipset with a smaller power may be chosen, which thereby limits performance of the product. Meanwhile, an overall height of an electronic product decreases continuously, a battery capacity is increasing, and a performance of a chip is being promoted. As a result, a surface temperature of the product becomes higher and higher. On the other hand, it is more and more demanding on user's usage experience of the product, so the surface temperature of an electronic product has become an important factor affecting the user's usage experience.

In existing solutions to the heat dissipating problem, a uniform temperature material is adopted to make the surface temperature more uniform, but less power consumption can be solved; or a vibrating diaphragm fan is adopted to take place of a conventional axial-flow fan and centrifugal fan, and such fans do not need space reserved for upper and lower air inlets, and a minimum height thereof can be 3 mm, which can meet requirement of a thinner overall system machine. However, different from working mechanisms of the conventional fan, the vibrating fan depends on a diaphragm vibrating up and down in a cavity, compresses air out of the cavity at a certain vibration frequency, the air being jetted out of a horizontal vent in a mode of pressure pulsation, and being blew to conventional vertically-arranged heat dissipating fins. Since the conventional vertically-arranged heat dissipating fins have very small gaps and are perpendicular to a horizontal jet direction, obstruction to the airflow by the conventional vertically-arranged heat dissipating fins results in turbulence and noises, which severely affects heat dissipating effect and user's usage experience.

When a heating device is dissipated heat, a region on the heat dissipating device not covered by the airflow blew out of the air outlet by the fan has a slow speed of heat dissipation, which renders a relatively high temperature on a shell of the electronic apparatus in contact with the region, the user's usage experience is affected.

In addition, the vibrating diaphragm fan has working mechanisms different from the conventional fan, the vibrating diaphragm fan depends on a diaphragm vibrating up and down in a vibrating diaphragm fan body, compresses air in the vibrating diaphragm fan body out of the vibrating diaphragm fan body at a certain vibration frequency, the air being jetted out of the horizontal vent in the mode of pressure pulsation. Since the vibrating diaphragm fan generates wind based on vibration principle, the vibrating diaphragm fan body will have much vibration. After the diaphragm vibrating fan is set in a system, it will drive the system to vibrate, so that the user's usage experience is very poor.

Therefore, problems as follows are urgently to be solved, i.e. how to reduce obstruction to the airflow horizontally jetted out of the air outlet of the fan by the heat dissipating fins of the heat dissipating device, and how to reduce noises, thereby enhancing the heat dissipating effect and improving the user's usage experience.

SUMMARY

In order to solve the above-described technical problem, according to a first aspect of the present application, there is provided a heat dissipating device, the heat dissipating device being located on a same base plate with a fan, and a first side of the heat dissipating device abutting an air outlet of the fan, the heat dissipating device comprising: a plurality of horizontal heat dissipating fins, the plurality of horizontal heat dissipating fins being horizontally arranged in parallel with each other in a stacked manner, such that arrangement of the plurality of horizontal heat dissipating fins is consistent with a direction of the air outlet of the fan, wherein two adjacent horizontal heat dissipating fins have a gap there between, through which air from the air outlet of the fan is discharged, wherein a first horizontal heat dissipating fin located at an uppermost layer among the plurality of horizontal heat dissipating fins is coupled with a heat pipe, the heat pipe is coupled with at least one heating element, and the heat pipe is configured to conduct heat of the heating element to the first horizontal heat dissipating fin.

According to a second aspect of the present application, there is provided an electronic apparatus, comprising a heat dissipating device, the heat dissipating device being located on a same base plate with a fan, and a first side of the heat dissipating device abutting an air outlet of the fan, the heat dissipating device comprising: a plurality of horizontal heat dissipating fins, the plurality of horizontal heat dissipating fins being horizontally arranged in parallel with each other in a stacked manner, such that arrangement of the plurality of horizontal heat dissipating fins is consistent with a direction of the air outlet of the fan, wherein two adjacent horizontal heat dissipating fins have a gap there between, through which air from the outlet of the fan is discharged, wherein a first horizontal heat dissipating fin located at an uppermost layer among the plurality of horizontal heat dissipating fins is coupled with a heat pipe, the heat pipe is coupled with at least one heating element, and the heat pipe is configured to conduct heat of the heating element to the first horizontal heat dissipating fin.

According to a third aspect of the present application, there is provided an electronic apparatus, the electronic apparatus may comprise: at least one heating electronic device; a heat dissipating device, made of a heat conducting material, the heat dissipating device comprising a base plate, a first group of heat dissipating fins and a second group of heat dissipating fins, the first group of heat dissipating fins and the second group of heat dissipating fins being disposed in parallel on a first surface of the base plate; a conducting section, disposed between the electronic device and the heat dissipating device, for conducting heat generated by the electronic device to the heat dissipating device for dissipation; an airflow acceleration device, whose air outlet blows out of airflow for covering the first group of heat dissipating fins, wherein a height of the first group of heat dissipating fins with respect to the base plate is greater than a height of the second group of heat dissipating fins with respect to the base plate.

It should be understood that both the foregoing general description and the following detailed description are exemplary and intended to provide a further illustration of the claimed technology.

BRIEF DESCRIPTION OF THE DRAWINGS

In order to more clearly illustrate the technical solution of the embodiments of the invention, the drawings necessary for description of the embodiments or the prior art will be briefly described in the following; it is obvious that the described drawings are only related to some embodiments of the invention and those skilled in the art may obtain other drawings according to these drawings without inventive effort.

DETAILED DESCRIPTION

Hereinafter, preferred embodiments of the present application will be described in detail with reference to the drawings. It should be noted that, in the specification and the drawings, the same reference numbers denote substantially the same steps and elements, and repeated explanation of these steps and elements will be omitted.

Figure 1:
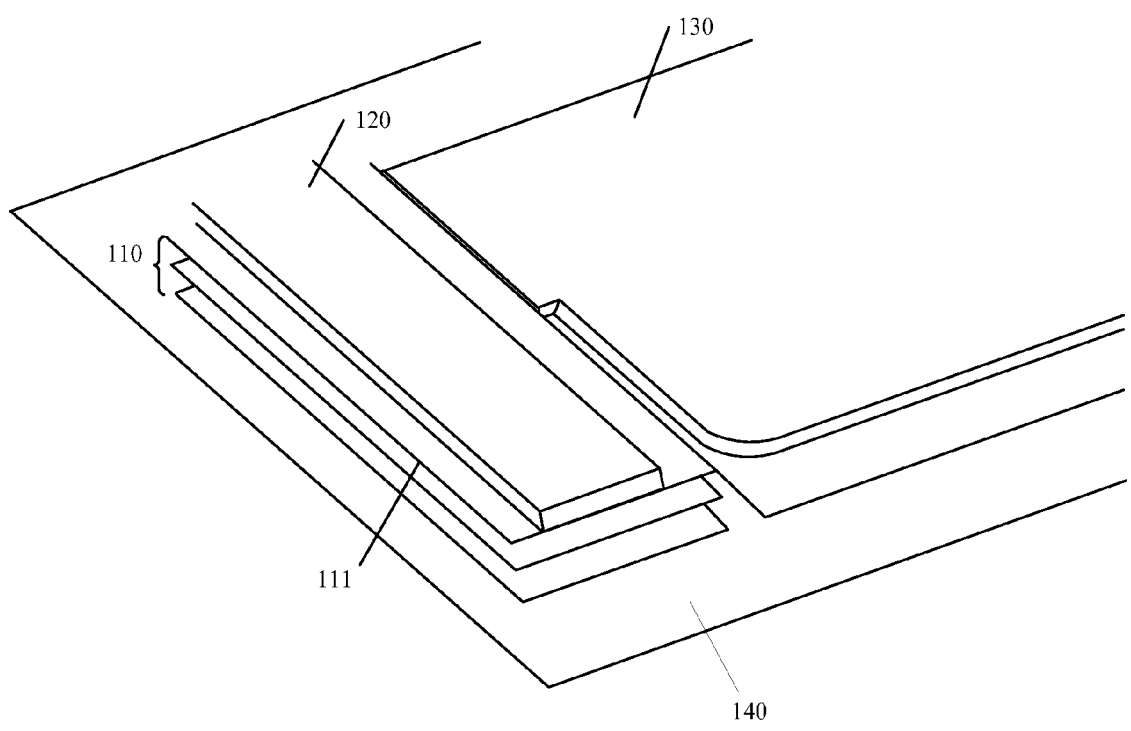
FIG. 1 shows an exemplary structural block diagram of a heat dissipating device 110 used for a fan 130 according to an embodiment of the present application.

Next, a heat dissipating device used for a fan according to an embodiment of the present application will be described with reference to FIG. 1. FIG. 1 shows an exemplary structural block diagram of a heat dissipating device 110 used for a fan 130 according to an embodiment of the present application. As shown in the diagram, the heat dissipating device 110 used for the fan 130 according to the embodiment of the present application is located on a same base plate 140 with the fan 130, and a first side of the heat dissipating device 110 adjacent to the fan 130 abuts an air outlet of the fan. The heat dissipating device 110 comprises a plurality of horizontal heat dissipating fins 111, and the plurality of horizontal heat dissipating fins 111 are horizontally arranged in parallel with each other in a stacked manner, such that arrangement of the plurality of horizontal heat dissipating fins 111 is consistent with a horizontal air-flowing direction of the air outlet of the fan 130. Two adjacent horizontal heat dissipating fins 111 have a gap there between, and the gap forms a channel for airflow, through which the air from the horizontal air outlet of the fan 130 is discharged. And, among the plurality of horizontal heat dissipating fins 111, a first horizontal heat dissipating fin located at an uppermost layer is coupled with a heat pipe 120. The heat pipe 120 is coupled with at least one heating element, and the heat pipe 120 is configured to conduct heat of the heating element to the first horizontal heat dissipating fin.

Specifically, as shown in FIG. 1, the heat dissipating device 110 according to the embodiment of the present application comprises a plurality of heat dissipating fins 111 extending in a horizontal direction and arranged in parallel with each other. The plurality of horizontal heat dissipating fins 111 may be made of materials such as copper and aluminum which have good heat-conducting performance and higher heat dissipating efficiency, and the arrangement of the plurality of horizontal heat dissipating fins 111 may be consistent with an air flowing direction of the air outlet of the fan 130. And, two adjacent horizontal heat dissipating fins 111 have a gap there between, and the gap forms a channel for airflow, so that the air jetted out of the fan in a horizontal manner can be conveniently discharged through the gap between the two adjacent horizontal heat dissipating fins. Therefore, the plurality of horizontal heat dissipating fins of the heat dissipating device 110 according to the embodiment of the present application can reduce obstruction to the horizontal airflow jetted out of the fan 130. In addition, among the plurality of horizontal heat dissipating fins, the horizontal heat dissipating fin located at the uppermost layer is coupled with the heat pipe 120, and the heat pipe 120 may be made of metal materials such as copper and aluminum alloy which have good heat-conducting performance and higher heat dissipating efficiency. The heat pipe 120 is coupled with at least one heating element in an electronic apparatus 800, the heating element may be semiconductor components such as a central processor and a graphics processor; these semiconductor components will produce a lot of heat during operation, which must promptly undergo a heat-dissipating process so that the semiconductor components can maintain stable operation. The heat pipe 120 is configured to conduct heat radiated from the heating element from the heating end to the heat dissipating fins near the fan 130 along the heat pipe, to facilitate the heating element to dissipate heat. Meanwhile, the heat dissipating device 110 is located on the same base plate 140 with the fan 130, and the side of the heat dissipating device 110 adjacent to the fan 130 abuts an air outlet of the fan 130. The large amount of airflow that the fan 130 can pass through the plurality of horizontal heat dissipating fins 111, and then blow the heat on the plurality of horizontal heat dissipating fins 111 and the adjacent heat pipe 120 out of the electronic apparatus.

Figure 2:
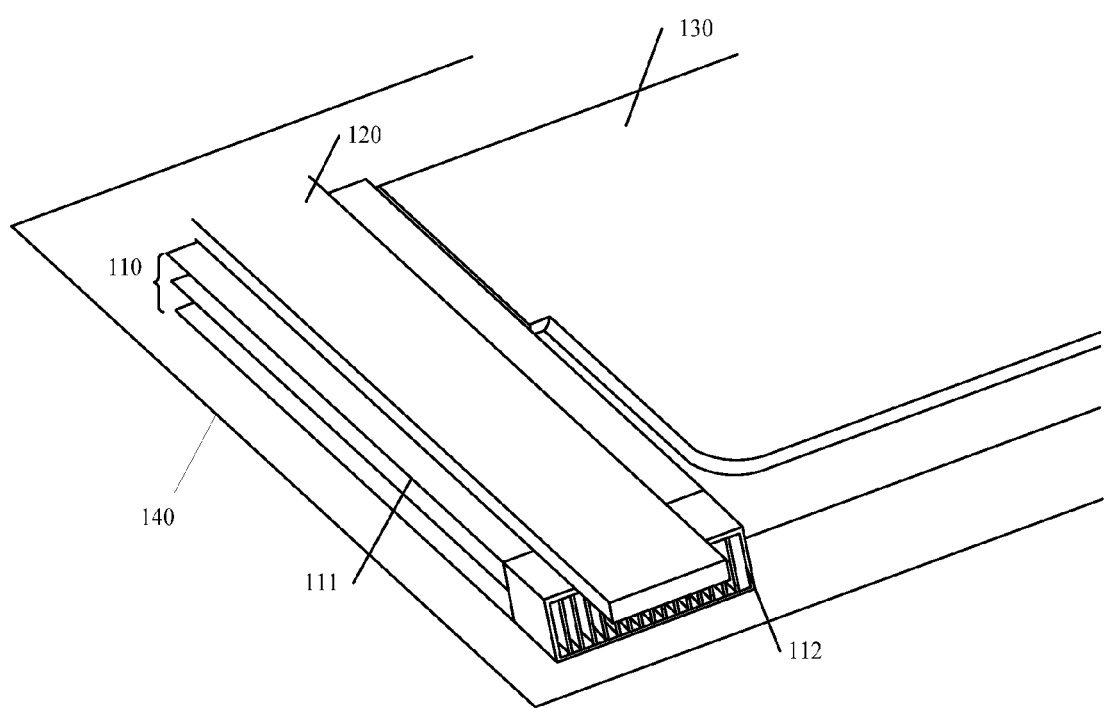
FIG. 2 shows an exemplary structural block diagram of a heat dissipating device 110 used for a fan 130 according to another embodiment of the present application.

As shown in FIG. 2, the heat dissipating device 110 used for the fan 130 according to the embodiment of the present application may further comprise a plurality of vertical heat dissipating fins 112. The plurality of vertical heat dissipating fins 112 are located at a second side of the heat dissipating device 110, and are configured to couple the plurality of horizontal heat dissipating fins 111 with each other, so that the plurality of vertical heat dissipating fins 112 can conduct heat in the horizontal heat dissipating fin which is located at the uppermost layer and is in contact with the heat pipe to other horizontal heat dissipating fins. Specifically, FIG. 2 shows an exemplary structural block diagram of a heat dissipating device 110 used for a fan 130 according to another embodiment of the present application. The plurality of vertical heat dissipating fins 112 of the heat dissipating device 110 are located at the second side capable of blowing cooling airflow outward which is adjacent to the first side adjacent of the heat dissipating device 110, and are configured to couple the plurality of horizontal heat dissipating fins 111 with each other. By setting the plurality of vertical heat dissipating fins 112, not only a heat dissipating area can be increased, but also more heat can be conducted via the vertical heat dissipating fins to other main body horizontal heat dissipating fins by connecting the vertical heat dissipating fins to the heat pipe via the horizontal heat dissipating fin at the uppermost layer, so as to further improve the heat dissipating efficiency of the heat dissipating device 110.

The heat dissipating device 110 according to the embodiment of the present application comprises the plurality of heat dissipating fins 111 arranged in parallel with each other in a horizontal direction, the arrangement of the plurality of horizontal heat dissipating fins 111 is consistent with an air flowing direction of the air outlet of the fan 130, and two adjacent horizontal heat dissipating fins 111 further have a certain gap there between. Therefore, the air jetted out of the fan in a horizontal manner can be conveniently discharged through the gap between the two adjacent horizontal heat dissipating fins. As compared with the conventional vertically-arranged heat dissipating fins, the heat dissipating device 110 according to the embodiment of the present application is capable of reducing obstruction to the horizontal airflow jetted out of the fan 130, thus the heat dissipating efficiency is enhanced and the user's usage experience is improved.

However, as shown in FIG. 2, since only the horizontal heat dissipating fin at the uppermost layer is in contact with the heat pipe 120, and other horizontal heat dissipating fins are in parallel with the heat pipe 120 which is likewise arranged horizontally, the other horizontal heat dissipating fins are not in direct contact with the heat pipe 120.

Figure 3:
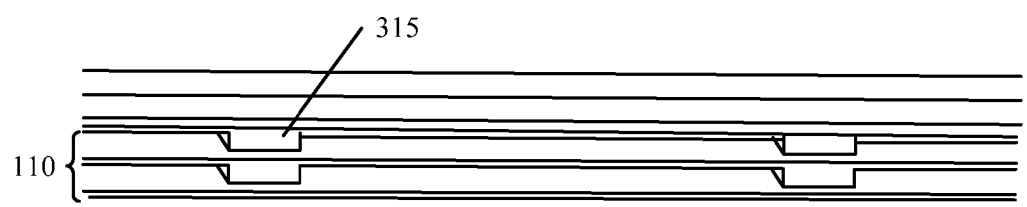
FIG. 3 shows an exemplary structural block diagram of a heat dissipating device 110 used for a fan 130 according to another embodiment of the present application.

Therefore, in order that more heat is conducted from the heat pipe more quickly and efficiently to all the horizontal heat dissipating fins, according to one embodiment of the present application, a plurality of vertical heat-conducting section 315 are also set in gaps between any two adjacent horizontal heat dissipating fins 111 among the plurality of horizontal heat dissipating fins 111. The vertical heat-conducting section is coupled with two adjacent horizontal heat dissipating fins to conduct heat between the two adjacent horizontal heat dissipating fins 111. Specifically, FIG. 3 shows an exemplary structural block diagram of a heat dissipating device 110 used for a fan 130 according to another embodiment of the present application. As shown in FIG. 3, the plurality of vertical heat-conducting section 315 may be made of metal material which has good heat-conducting performance, such as copper, stainless steel, aluminum and the like. An upper horizontal heat dissipating fin in adjacent horizontal heat dissipating fins may conduct heat to a lower horizontal heat dissipating fin through the plurality of vertical heat-conducting section 315, so as to avoid heat concentrating in the upper horizontal heat dissipating fin, so that heat distribution is more uniform, and more heat can be brought away by the airflow blew out of the fan 130, so as to improve the heat dissipating efficiency.

Figure 4:
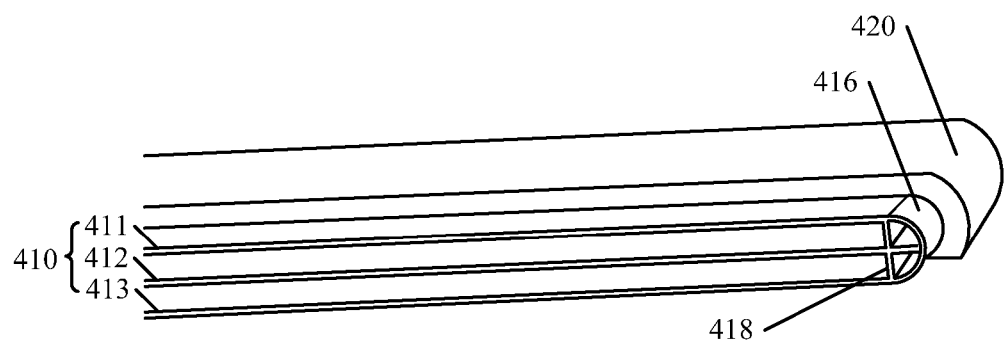
FIG. 4 shows an exemplary structural block diagram of a heat dissipating device 410 used for a fan 130 according to another embodiment of the present application.

Optionally, in another embodiment of the present application, the plurality of horizontal heat dissipating fins extend to a vertical direction on a second side of the heat dissipating device and are closed connected with each other, meanwhile the heat pipe extends to the second side of the heat dissipating device, so that heat of the heat pipe is conducted to all the horizontal heat dissipating fins. Specifically, FIG. 4 shows an exemplary structural block diagram of a heat dissipating device 410 used in a fan 130 according to another embodiment of the present application. As shown in FIG. 4, the heat dissipating device 410 comprises, successively from top to bottom, a first layer of horizontal heat dissipating fins 411, a second layer of horizontal heat dissipating fins 412, and a third layer of horizontal heat dissipating fins 413. The first layer of horizontal heat dissipating fins 411 and the third layer of horizontal heat dissipating fins 413 are connected with one another via an arc heat dissipating fin section 416. The second layer of horizontal heat dissipating fins 412 extend to the arc heat dissipating fin section 416, and are coupled with the arc heat dissipating fin section 416. Thus, heat of the first layer of horizontal heat dissipating fins 411 of the heat dissipating device 410 may be conducted to the lower second layer of horizontal heat dissipating fins 412 and the third layer of horizontal heat dissipating fins 413 via the arc heat dissipating fin section 416. Meanwhile, a heat pipe 420 extends to a second side of the heat dissipating device to form an arc shape, which is in contact with the arc heat dissipating fin section 416 and covers the same externally, so that heat in the heat pipe 420 can be conducted more efficiently to the first layer of horizontal heat dissipating fins 411, the second layer of horizontal heat dissipating fins 412 and the third layer of horizontal heat dissipating fins 413. In addition, side heat dissipating fins 418 may be set on the side of the heat dissipating device 410, to conduct the heat in the first layer of horizontal heat dissipating fins 411 below to the second layer of horizontal heat dissipating fins 412 and the third layer of horizontal heat dissipating fins 413 via the side heat dissipating fins 418, so that the heat may be distributed more uniformly among the first layer of horizontal heat dissipating fins 411, the second layer of horizontal heat dissipating fins 412 and the third layer of horizontal heat dissipating fins 413, so as to further improve the heat dissipating efficiency.

Figure 5:
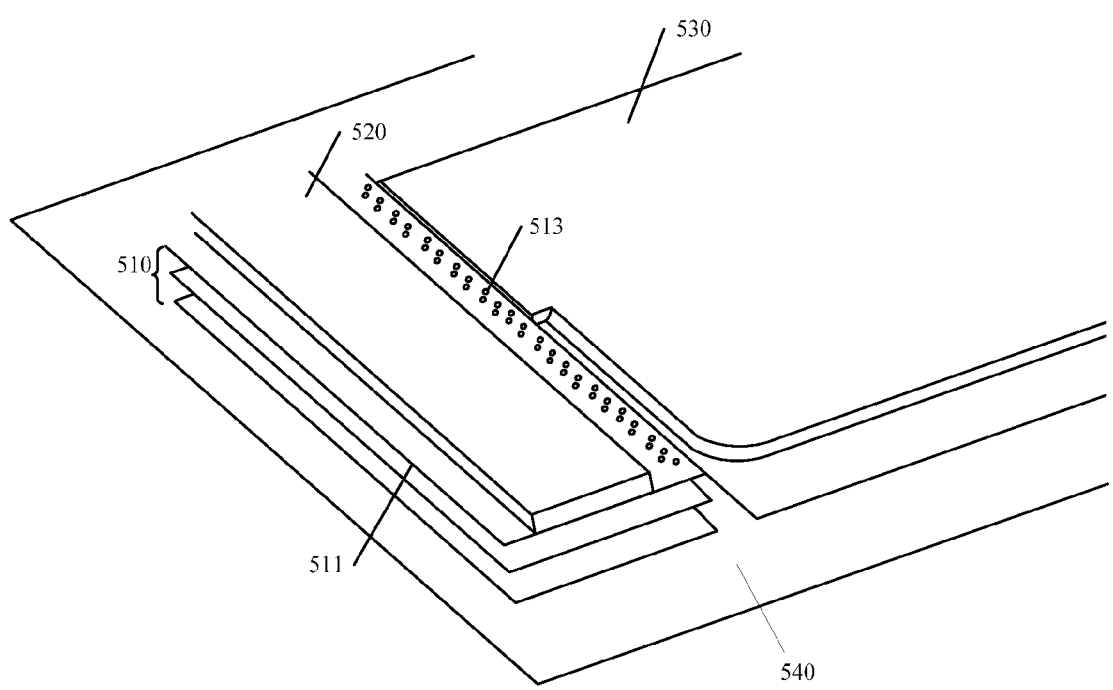
FIG. 5 shows an exemplary structural block diagram of a heat dissipating device 510 used for a fan 130 according to another embodiment of the present application.

Further, in another embodiment of the present application, the horizontal heat dissipating fins have at least one aperture in a position adjacent to an air inlet of the fan, a diameter of the aperture being less than 1 mm. Specifically, FIG. 5 shows a schematic structural block diagram of a heat dissipating device 500 according to another embodiment of the present application. As shown in FIG. 5, a horizontal heat dissipating fin which is at an uppermost layer and is in contact with a heat pipe 520 has a plurality of apertures 513 in positions adjacent to an air inlet of a fan 530, a diameter of an aperture 513 being less than 1 mm, so that more air may be provided into the heat dissipating device 510, to increase the air volume so as to improve the heat dissipating efficiency. Meanwhile, when the airflow passes through the apertures, spectrum of jet noise will shift to a high frequency or an ultra-high frequency, so that the frequency of the jet noise becomes a frequency inaudible or difficult to hear by human beings, and audible jet noise components in the frequency spectrum is significantly reduced, thereby decreasing interference to human.

Additionally, in one embodiment, a heat dissipating device according to the embodiment of the present application may be applicable to a vibrating diaphragm fan. The vibrating diaphragm fan has a structure different from that of a conventional fan. The vibrating diaphragm fan, depending on a diaphragm vibrating up and down in a cavity thereof, compresses air out of the cavity at a certain vibration frequency, the air being jetted out of a horizontal vent in a mode of pressure pulsation. However, heat dissipating fins of the conventional heat dissipating device used for a fan are designed to be arranged vertically, which will obstruct air horizontally jetted out of the fan. The heat dissipating device provided in the present application is capable of conveniently discharging the air jetted out of the fan 130 in a horizontal manner through the gap between two adjacent horizontal heat dissipating fins. As compared with the conventional vertically-arranged heat dissipating fins, the heat dissipating device according to the embodiment of the present application is capable of reducing obstruction to the horizontal airflow jetted out of the fan, thus enhancing the heat dissipating efficiency and improving the user's usage experience.

In a conventional vibrating diaphragm fan, a vibrating diaphragm fan body is in direct contact with a main board of an electronic apparatus. Because the vibrating diaphragm fan body is in direct contact with the electronic apparatus, vibration generated by the vibrating diaphragm fan body is directly transferred to the electronic apparatus, which will cause the problem of vibration of the electronic apparatus. An embodiment of the present application provides a vibrating diaphragm fan capable of damping used for an electronic apparatus. Hereinafter, the vibrating diaphragm fan capable of damping used for the electronic apparatus will be described with reference to FIG. 6 and FIG. 7.

Figure 6:
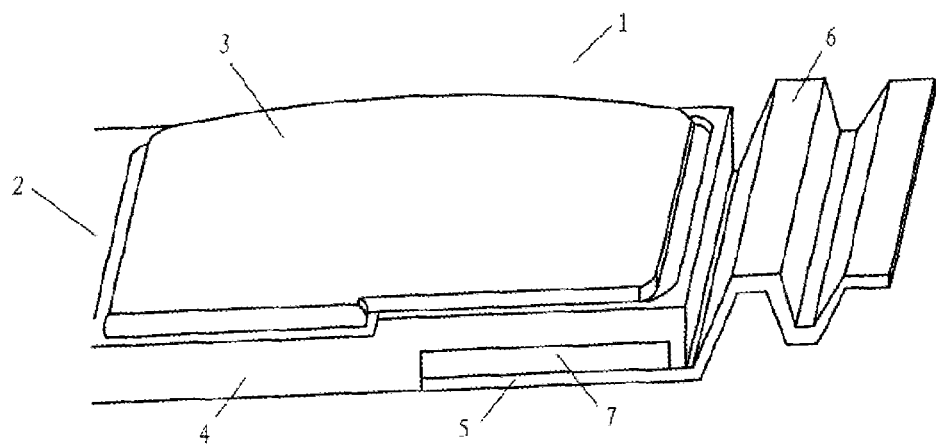
FIG. 6 is an implementation mode of a vibrating diaphragm fan capable of damping used for an electronic apparatus according to the present application.
Figure 7:
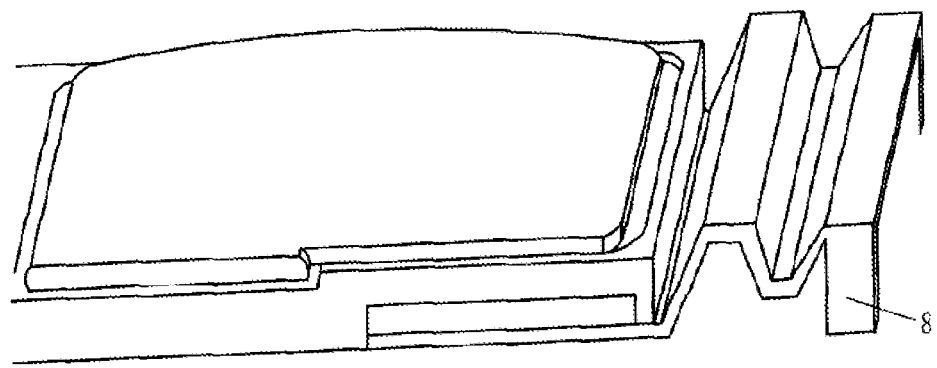
FIG. 7 is another implementation mode of the vibrating diaphragm fan capable of damping used for an electronic apparatus according to the present application.

FIG. 6 and FIG. 7 are respectively two implementation modes of a vibrating diaphragm fan capable of damping used for an electronic apparatus according to the embodiment of the present application.

As shown in FIG. 6, a vibrating diaphragm fan 1 capable of damping used for an electronic apparatus comprises a vibrating diaphragm fan body 2, the vibrating diaphragm fan body 2 comprising a vibrating diaphragm 3 and a shell supporting the vibrating diaphragm, the shell supporting the vibrating diaphragm being divided into a side shell 4 and a bottom shell 5, the side shell 4 being provided with an aperture 7 for air inlet and/or air outlet. The vibrating diaphragm fan 1 further comprises a damping bracket for reducing effect of vibration of the vibrating diaphragm fan on the electronic apparatus. In the two embodiments, the damping bracket is a corrugated edge fold 6. The corrugated edge fold 6 supports the vibrating diaphragm fan body 2 on the electronic apparatus (not shown), and the vibrating diaphragm fan body 2 is not in direct contact with the electronic apparatus.

The vibrating diaphragm fan according to the embodiment of the present application is provided with a damping bracket, which is a corrugated edge fold herein. The damping bracket can support the vibrating diaphragm fan body comprising the vibrating diaphragm and the shell supporting the vibrating diaphragm, and make the vibrating diaphragm fan body not in direct contact with the electronic apparatus. The vibration generated by the vibrating diaphragm fan body will be transferred to the damping bracket, rather than to the electronic apparatus directly, and the damping bracket can absorb or reduce part of vibration energy generated by the vibrating diaphragm fan body. Therefore, the vibration generated by the vibrating diaphragm fan body and finally transferred to the electronic apparatus via the damping bracket will be greatly reduced, which thereby improves the user's usage experience, and also reaches the purpose of dissipating heat of the electronic apparatus by using the vibrating diaphragm fan. Overall dimension of the electronic apparatus is reduced and overall performance and heat-dissipating performance of the electronic apparatus is improved.

Although, in both embodiments, the corrugated edge fold is used as the damping bracket, implementation modes of the damping bracket are not limited thereto. For example, springs with great intensity and any other known damping bracket that can implement a damping function may be used as well.

Here, the damping bracket is a corrugated edge fold extending from an edge of the bottom shell 5 to an exterior of the shell and being bent. There is at least one corrugated edge fold. An appropriately increasing of the number of the corrugated edge folds may improve damping performance of the damping bracket. When there is a plurality of corrugated edge folds, the vibration energy may be attenuated in a process of transferring vibration generated by the vibrating diaphragm fan body via the corrugated edge folds, and less of the above vibration will be transferred to the electronic apparatus.

The damping bracket may extend from opposite sides of the bottom edge of the shell to the exterior of the shell. FIG. 6 and FIG. 7 merely show that the damping bracket of a corrugated edge fold extends from an edge of the bottom shell 5 to an exterior of the shell rightwards. On an opposite side, there is also a damping bracket in a corrugated edge fold form which extends from the edge of the bottom shell 5 to the exterior of the shell rightwards.

The corrugated edge fold extends from the edge of the bottom shell 5 to the exterior of the shell and is not in contact with the side shell 4. The corrugated edge fold 6 is directly connected with the electronic apparatus and supports the vibrating diaphragm fan body 2 on the electronic apparatus, the vibrating diaphragm fan body being not in direct contact with the electronic apparatus. Specific properties of the corrugated edge fold enable that the corrugated edge fold has a better damping effect.

A damping material is set at an end of one corrugated edge fold farthest from the shell edge along the extending direction, so that the end of the corrugated edge fold are connected with the electronic apparatus in a damping manner. In FIG. 6 and FIG. 7, the corrugated edge fold farthest from the shell edge along the extending direction refers to a rightmost corrugated edge fold. As to corrugated edge folds set on a left side of the bottom shell, the corrugated edge fold farthest from the shell edge along the extending direction refers to a leftmost corrugated edge fold. In the implementation modes of FIG. 6 and FIG. 7, the extending direction indicates a direction extending towards the right, and the corrugated edge fold farthest from the shell edge along the extending direction refers to the corrugated edge fold farthest from the shell edge along the direction extending towards the right.

Setting the damping material at the end of one corrugated edge fold farthest from the shell edge along the extending direction can further reduce vibration generated by the vibrating diaphragm fan body and transferred to the electronic apparatus, and further improve damping performance of the vibrating diaphragm fan. The damping material may be foam or vibration isolating rubber.

The corrugated edge fold is made of a thin material. Here, the corrugated edge fold is fabricated with the thin material, and due to overall thinness, the corrugated edge fold can have good elasticity, and have flexibility similar to that of a spring, thus providing a better damping effect.

As shown in FIG. 7, a reinforcing rib 8 is provided at the end of corrugated edge fold farthest from the shell edge along the direction extending towards the right.

Because the corrugated edge fold is made of the thin material here, rigidity of the corrugated edge fold is somewhat decreased, and the reinforcing rib 8 being provided at the end of the corrugated edge fold farthest from the shell edge may improve rigidity of the corrugated edge fold.

Typically, the end of the corrugated edge fold is connected to the shell or the mainboard of the electronic apparatus. In a case that the reinforcing rib and/or the damping material are provided, the reinforcing rib and/or the damping material are/is connected to the shell or the mainboard of the electronic apparatus via the corrugated edge fold. Also, the vibrating diaphragm fan body connected to the electronic apparatus via the corrugated edge fold will not be direct contact with the electronic apparatus.

Typically, the ends of the corrugated edge fold are connected to the shell or the mainboard of the electronic apparatus by a screw or an adhesive. However, the connection modes are not limited thereto, any connection modes can be used as long as the vibrating diaphragm fan body can be connected with the electronic apparatus via the corrugated edge fold, so that the vibrating diaphragm fan body will not be in direct contact with the electronic apparatus, and they can play a good role in damping and heat dissipation.

The vibrating diaphragm fan capable of damping according to the embodiment of the present application can well reduce effect of the vibrating diaphragm fan body on the electronic apparatus, reach the purpose of good heat dissipation, which effectively reduces the overall dimension of the electronic apparatus, enhances the performance of the electronic apparatus, and improve the user's usage experience.

Figure 8:
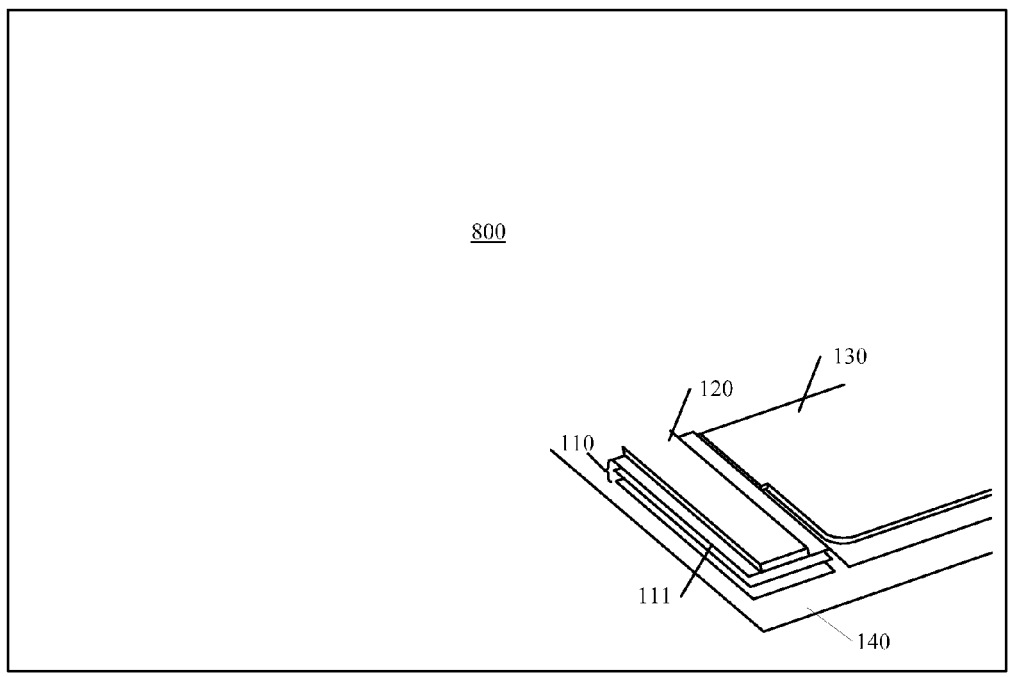
FIG. 8 shows an exemplary structural block diagram of an electronic apparatus 800 having a heat dissipating device according to an embodiment of the present application.

Next, an electronic apparatus having a heat dissipating device according to an embodiment of the present application will be described with reference to FIG. 8. FIG. 8 shows an exemplary structural block diagram of an electronic apparatus 800 having a heat dissipating device 110 according to an embodiment of the present application. As shown in FIG. 8, the electronic apparatus 800 of this embodiment comprises a heat dissipating device 110, a heat pipe 120 and a fan 130. The heat pipe 120 may be made of metal materials such as copper and aluminum alloy which have good heat-conducting performance, and higher heat dissipating efficiency. The heat dissipating device 110 used for the fan 130 is located on a same base plate 140 with the fan 130, and a side of the heat dissipating device 110 adjacent to the fan 130 abuts an air outlet of the fan 130. The heat dissipating device 110 comprises a plurality of horizontal heat dissipating fins 111. The plurality of horizontal heat dissipating fins 111 are horizontally arranged in parallel with each other in a stacked manner, such that arrangement of the plurality of horizontal heat dissipating fins 111 is consistent with an air flowing direction of the air outlet of the fan 130. Two adjacent horizontal heat dissipating fins 111 have a gap there between, through which the air from the horizontal air outlet of the fan 130 is discharged. And, among the plurality of horizontal heat dissipating fins 111, a first horizontal heat dissipating fin located at an uppermost layer is coupled with the heat pipe 120, the heat pipe 120 is coupled with at least one heating element, and the heat pipe 120 is configured to conduct heat of the heating element to the first horizontal heat dissipating fin.

Specifically, the heat dissipating device 110 of the electronic apparatus 800 according to the embodiment of the present application comprises a plurality of heat dissipating fins extending in a horizontal direction and arranged in parallel with each other, which reduces obstruction to the horizontal airflow jetted out of the fan. In addition, among the plurality of horizontal heat dissipating fins, the horizontal heat dissipating fin located at the uppermost layer is coupled with the heat pipe 120. The heat pipe 120 is coupled with at least one heating element in the electronic apparatus 800. The heating element may be semiconductor components such as a central processor and a graphics processor. These semiconductor components will produce a lot of heat during operation, which must promptly undergo a heat-dissipating process so that the semiconductor components can maintain stable operation. The heat pipe 120 is configured to conduct heat radiated from the heating element of the electronic apparatus 800 from the heating end to the heat dissipating fins near the fan 130 along the heat pipe, in order to facilitate the heating element to dissipate heat. Meanwhile, the heat dissipating device 110 is located on the same base plate 140 with the fan 130, and the side of the heat dissipating device 110 adjacent to the fan 130 abuts an air outlet of the fan 130. The large amount of airflow that the fan 130 can blow passes through the plurality of horizontal heat dissipating fins 111, and then brings the heat on the plurality of horizontal heat dissipating fins 111 and the adjacent heat pipe 120 out of the electronic apparatus.

In one embodiment of the present application, the heat dissipating device 110 of the electronic apparatus 800 may further comprise a plurality of vertical heat dissipating fins 112. The plurality of vertical heat dissipating fins 112 are located at a second side of the heat dissipating device 110, and are configured to couple the plurality of horizontal heat dissipating fins 111 with each other, so that the plurality of vertical heat dissipating fins can conduct heat in the horizontal heat dissipating fin which is located at the uppermost layer and is in contact with the heat pipe to other horizontal heat dissipating fins. By adding the vertical heat dissipating fins on the side of the horizontal heat dissipating fins 111, not only a heat dissipating area can be increased, but also more heat can be conducted via the vertical heat dissipating fins to other main body horizontal heat dissipating fins by connecting the vertical heat dissipating fins to the heat pipe via the horizontal heat dissipating fin at the uppermost layer, so that the heat can be discharged from the electronic apparatus more rapidly, so as to further improve the heat dissipating efficiency of the electronic apparatus 800.

As compared with the conventional vertically-arranged heat dissipating fins, the heat dissipating device 110 of the electronic apparatus 800 according to the embodiment of the present application has a plurality of horizontal main body heat dissipating fins, and is capable of reducing obstruction to the horizontal airflow jetted out of the fan 130, thus enhancing the heat dissipating efficiency and improving the user's usage experience. However, since only the horizontal heat dissipating fin at the uppermost layer is in contact with the heat pipe 120, and other horizontal heat dissipating fins are in parallel with the heat pipe 120 which is likewise arranged horizontally, the other horizontal heat dissipating fins are not in direct contact with the heat pipe 120.

Therefore, in order that more heat is conducted from the heat pipe more quickly and efficiently to all the horizontal heat dissipating fins, alternatively, according to one embodiment of the present application, a plurality of vertical heat-conducting section are set in gaps between any two adjacent horizontal heat dissipating fins 111 among the plurality of horizontal heat dissipating fins 111. The vertical heat-conducting part is coupled with two adjacent horizontal heat dissipating fins to conduct heat between the two adjacent horizontal heat dissipating fins 111. Thereby, an upper horizontal heat dissipating fin in adjacent horizontal heat dissipating fins may conduct heat to a lower horizontal heat dissipating fin, so as to avoid heat concentrating in the upper horizontal heat dissipating fin. Therefore, heat distribution is more uniform, and more heat can be brought away from the electronic apparatus 800 by the airflow blew out of the fan 130, so as to improve the heat dissipating efficiency of the electronic apparatus 800.

Optionally, in another embodiment of the present application, the plurality of horizontal heat dissipating fins 111 on the second side of the heat dissipating device 110 extend to a vertical direction and are closed connected with each other. Meanwhile, the heat pipe 120 extends to the second side of the heat dissipating device 110, so that heat of the heat pipe 120 is conducted to all the horizontal heat dissipating fins 111. For example, in an example, the heat dissipating device 110 of the electronic apparatus 800 may comprise, successively from top to bottom, a first layer of horizontal heat dissipating fins, a second layer of horizontal heat dissipating fins, and a third layer of horizontal heat dissipating fins. The first layer of horizontal heat dissipating fins and the third layer of horizontal heat dissipating fins are connected with one another via an arc heat dissipating fin section, the second layer of horizontal heat dissipating fins extend to the arc heat dissipating fin section, and are coupled with the arc heat dissipating fin section. Thus, heat of the first layer of horizontal heat dissipating fins of the heat dissipating device may be conducted to the lower second layer of horizontal heat dissipating fins and the third layer of horizontal heat dissipating fins via the arc heat dissipating fin section. Meanwhile, the heat pipe extends to a second side of the heat dissipating device to form an arc shape, and is in contact with the arc heat dissipating fin section and covers the same externally, so that heat in the heat pipe can be conducted more efficiently to the first layer of horizontal heat dissipating fins, the second layer of horizontal heat dissipating fins and the third layer of horizontal heat dissipating fins. In addition, side heat dissipating fins may be set on the side of the heat dissipating device, and thus the heat in the horizontal heat dissipating fin which is located at the uppermost layer and is in direct contact with the heat pipe can be conduct to respective lower horizontal heat dissipating fins via the side heat dissipating fins, so that the heat may be distributed more uniformly among a plurality of horizontal heat dissipating fins, so as to further improve the heat dissipating efficiency of the electronic apparatus 800.

Further, in another embodiment of the present application, the horizontal heat dissipating fins have at least one aperture in a position adjacent to an air inlet of the fan, a diameter of the aperture being less than 1 mm, so that more air may be provided into the heat dissipating device to increase the air volume, so as to improve the heat dissipating efficiency. Meanwhile, when the airflow passes through the apertures, spectrum of jet noise will shift to a high frequency or an ultra-high frequency, so that the frequency of the jet noise becomes a frequency inaudible or difficult to hear by human beings. Audible jet noise components in the frequency spectrum are thus significantly reduced, thereby decreasing interference to human.

Additionally, in one embodiment, a heat dissipating device of an electronic apparatus according to the embodiment of the present application may be applicable to a vibrating diaphragm fan. The vibrating diaphragm fan has a structure different from that of a conventional fan. The vibrating diaphragm fan, depending on a diaphragm vibrating up and down in a cavity thereof, compresses air out of the cavity at a certain vibration frequency, the air being jetted out of a horizontal vent in a mode of pressure pulsation. However, heat dissipating fins of the conventional heat dissipating device used for a fan are designed to be arranged vertically, which will obstruct air horizontally jetted out of the fan. The heat dissipating device provided in the present application is capable of conveniently discharging the air jetted out of the fan in a horizontal manner through the gap between two adjacent horizontal heat dissipating fins. As compared with the conventional vertically-arranged heat dissipating fins, the heat dissipating device according to the embodiment of the present application is capable of reducing obstruction to the horizontal airflow jetted out of the fan, thus enhancing the heat dissipating efficiency and improving the user's usage experience. In addition, the vibrating diaphragm fan may have the structures described in conjunction with FIG. 6 and FIG. 7.

Figure 9:
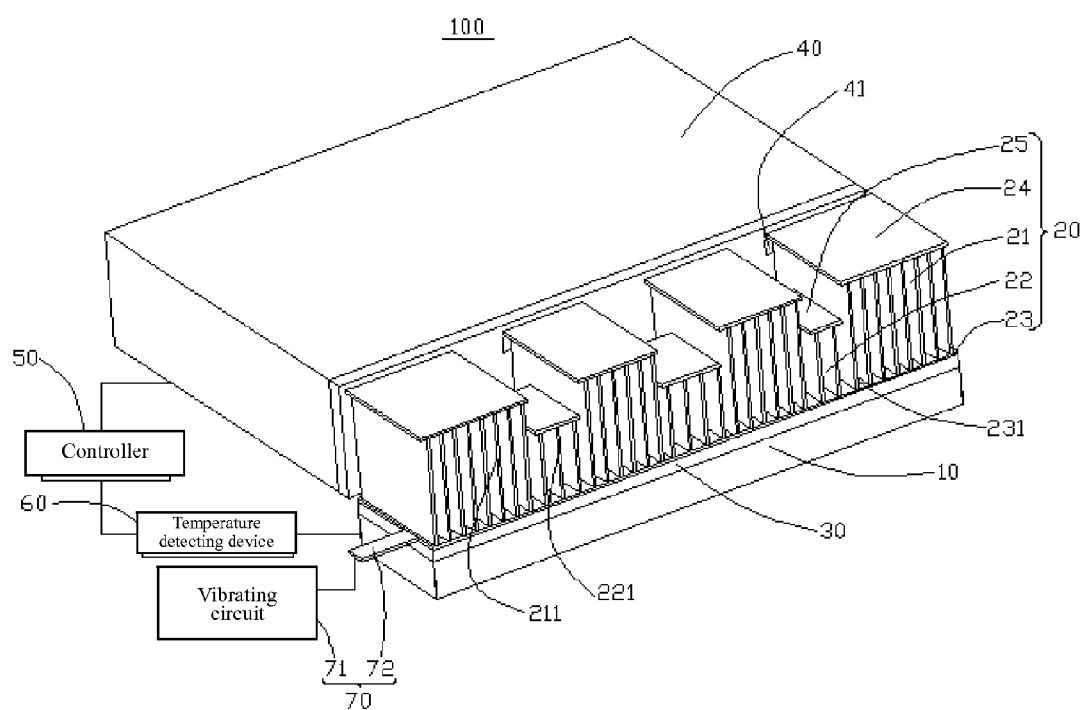
FIG. 9 is a structural schematic diagram of an electronic apparatus according to a preferred implementation mode of the present application.

As shown in FIG. 9, it is a structural schematic diagram of an electronic apparatus 100 according to a preferred implementation mode of the present application. The electronic apparatus 100 may be a mobile phone, a tablet, a laptop, a game console and so on. The electronic apparatus 100 comprises at least one heating electronic device 10, a heat dissipating device 20, a conducting section 30 and an airflow acceleration device 40.

The electronic device 10 may be any heating electronic device, such as a chip.

The heat dissipating device 20 is made of heat-conducting materials, such as aluminum, copper, and aluminum alloy. The heat dissipating device 20 is capable of exchanging heat absorbed thereby with ambient air, so as to implement head radiation. The heat dissipating device 20 includes a base plate 23, a first group of heat dissipating fins 21 and a second group of heat dissipating fins 22 The first heat dissipating fin group 21 and the second heat dissipating fin group 22 are disposed in parallel on a first surface 231 of the base plate 23. A height of the first group of heat dissipating fins 21 with respect to the base plate 23 is greater than a height of the second group of heat dissipating fins 22 with respect to the base plate 23.

The conducting section 30 is disposed between the electronic device 10 and the heat dissipating device 20, and is used for conducting heat generated by the electronic device 10 to the heat dissipating device 20 for dissipation. The conducting section 30 is made of a material with high thermal conductivity, to improve heat conductivity between the electronic device 10 and the heat dissipating device 20. The conducting section 30 may be made of materials such as graphene, heat conduct silica gel and heat conduct cream. Setting the conducting section 30 can not only fill the gap between the heat dissipating device 20 and the electronic device 10 to enhance efficiency of heat transmission, but also plays a role in damping and insulation.

The airflow acceleration device 40 is used for accelerating a flow rate of airflow. The airflow blew out of an air outlet 41 of the airflow acceleration device 40 is capable of covering the first group of heat dissipating fins 21. Thus, during heat dissipating, a heat dissipating rate on the first group of heat dissipating fins 21 is greater than a heat dissipating rate on the second group of heat dissipating fins 22. The airflow acceleration device 40 may specifically be a fan or an air pump. Specifically, in order to reduce a dimension of the electronic apparatus 100, the airflow acceleration device 40 may specifically be a vibrating diaphragm fan. The vibrating diaphragm fan may have the structures described in conjunction with FIG. 6 and FIG. 7.

Since the height of the first group of heat dissipating fins 21 which are on the heat dissipating device 20 of the electronic apparatus 100 and can be covered by the airflow blew out of the air outlet of the airflow acceleration device 40 with respect to the base plate 23 is set to be greater than the height of the second group of heat dissipating fins 22 with respect to the base plate 23, the second group of heat dissipating fins 22 can be avoided to be in contact with the shell of the electronic apparatus 100, thus the temperature of the shell of the electronic apparatus is reduced. In the meantime, heat dissipation can be carried out timely through the first group of heat dissipating fins 21. Accordingly, a technical problem in the prior art as follows is solved, i.e. because the plurality of heat dissipating fins of the heat dissipating device are same in height, and part of the regions on the heat dissipating device can be covered by the airflow blew out of the air outlet of the airflow acceleration device, a dissipation rate in the regions not covered by the airflow blew out of the air outlet of the airflow acceleration device of the heat dissipating device is relatively slow during heat dissipation of the heating device, which renders a relatively high temperature of the shell of the electronic apparatus in contact with the regions, the user's usage experience is affected. Technical effects of reducing the temperature of the shell of the electronic apparatus and improving the user's usage experience are achieved.

Specifically, the first group of heat dissipating fins 21 may include a plurality of first heat dissipating fins 211 disposed in parallel on the first surface 231. The second group of heat dissipating fins 22 may include a plurality of second heat dissipating fins 221 disposed in parallel on the first surface 231. A height of the plurality of first heat dissipating fins 211 with respect to the base plate 22 is greater than a height of the plurality of second heat dissipating fins 221 with respect to the base plate 22. And heights of respective first heat dissipating fins in the plurality of first heat dissipating fins 211 may be same or different. Likewise, heights of respective second heat dissipating fins in the plurality of second heat dissipating fins 221 may be same or different.

Further, in order to improve the heat dissipating efficiency, a gap between two adjacent first heat dissipating fins 211 in the plurality of first heat dissipating fins 211 is set to be less than a gap between two adjacent second heat dissipating fins 221 in the plurality of second heat dissipating fins 221. That is to say, the number of the first heat dissipating fins 211 is increased, and the number of the second heat dissipating fins 221 is decreased, so as to increase heat absorption of the first heat dissipating fins 211 to improve the heat dissipating efficiency, and to decrease the heat absorption of the second heat dissipating fins 221 to reduce heat accumulated on the second heat dissipating fins 221. Therefore, excessively high temperature on a region of the electronic device 10 opposite to the second heat dissipating fins 221 is avoided, so as to protect the electronic device 10.

In order to increase a heat dissipating area of the heat dissipating device 20, the heat dissipating device 20 may further include a first cover 24 and a second cover 25. The first cover 24 may be fixedly connected with ends of the plurality of first heat dissipating fins 211 far away from the base plate 23, and the second cover 25 may be fixedly connected with ends of the plurality of second heat dissipating fins 221 far away from the base plate. By setting the first cover 24 at the ends of the plurality of first heat dissipating fins 211 far away from the base plate 23 and setting the second cover 25 at the ends of the plurality of second heat dissipating fins 221 far away from the base plate 23, the heat dissipating area of the heat dissipating device 20 is increased so as to promote the heat dissipating efficiency.

Specifically, in order to further improve the conduction efficiency, the electronic apparatus 100 further comprises a controller 50 and a temperature detecting device 60. The temperature detecting device 60 is used for detecting temperature of the electronic device 10. The controller 50 is used for controlling an air source temperature or a flow rate or a rotation speed of the airflow acceleration device 40 according to a detected temperature. For example, when the temperature of the electronic device 10 reaches an alarm temperature, the controller 50 can control the airflow acceleration device 40 either to reduce the air source temperature, or to increase the flow rate, or to increase the rotation speed based on the temperature, so as to accelerate an exchange rate of the heat dissipated by the electronic device 10 and to timely conduct the heat generated by the electronic device 10, to protect the electronic device 10. Also, when the temperature of the electronic apparatus 10 is lower than a safety temperature, the controller 50 may control the airflow acceleration device 40 to reduce the air source temperature, or increase the flow rate or rotation speed based on the temperature, so as to improve utilization of resources and to avoid waste of energy.

Further, the electronic apparatus 100 further comprises a drive section 70, the drive section 70 being used for driving the heat dissipating device 20 to vibrate, in order to enhance the heat dissipating efficiency. When the heat dissipating device 20 vibrates, an ambient air flow rate is accelerated, thus a heat exchange rate and a heat dissipating rate between the heat dissipating device and the ambient air is increased. By setting the drive section 70 for driving the heat dissipating device 20 to vibrate, the ambient air flow rate is accelerated, thus increasing a heat exchange rate and a heat dissipating rate between the heat dissipating device and the ambient air. Accordingly, the technical problem in the prior art as follows is solved, i.e. the heat generated by the heating device cannot be timely conducted, resulting in a relatively high temperature of the heating device and affecting operation of the heating device. The technical effect of improving the heat dissipating efficiency of the electronic apparatus is achieved.

Type One: Driven by an Oscillation Circuit and a Piezoelectric Ceramic

As shown in FIG. 9, the drive section 70 includes an oscillation circuit 71 and a piezoelectric ceramic 72 connected with the oscillation circuit 71. The heat dissipating device 20 is fixed onto the piezoelectric ceramic 72. When a current passes through the oscillation circuit 71, the piezoelectric ceramic 72 will vibrate, to drive the heat dissipating device 20 to vibrate.

The piezoelectric ceramic 72 is a functional ceramic material which can convert mechanical energy and electrical energy to each other, belongs to inorganic non-metallic materials, and can be specifically one of piezoelectric ceramics such as barium titanate series, lead zirconate titanate binary series, and partial niobate acid salt series.

The oscillation circuit 71 is a circuit which can generate an oscillation current, and the oscillation current is a current whose intensity and direction change with cycle. The oscillation circuit 71 may be an LC oscillation circuit, a quartz crystal oscillation circuit, or an RC oscillation circuit, etc.

By setting the oscillation circuit 71 and the piezoelectric ceramic 72 which is connected with the oscillation circuit 71 and is fixedly connected with the heat dissipating device 20, when a current passes through the oscillation circuit 71, the oscillation circuit 71 will generate an oscillation current, and the piezoelectric ceramic 72 will vibrate upon excitation of the oscillation current, so as to drive the heat dissipating device 20 to vibrate to accelerate the ambient air flow rate. Accordingly, the heat exchange rate between the heat dissipating device 20 and the ambient air is increased, so as to enhance the heat dissipating rate.

Type Two: Driven by a Vibrating Motor and a Leaf Spring.

Figure 10:
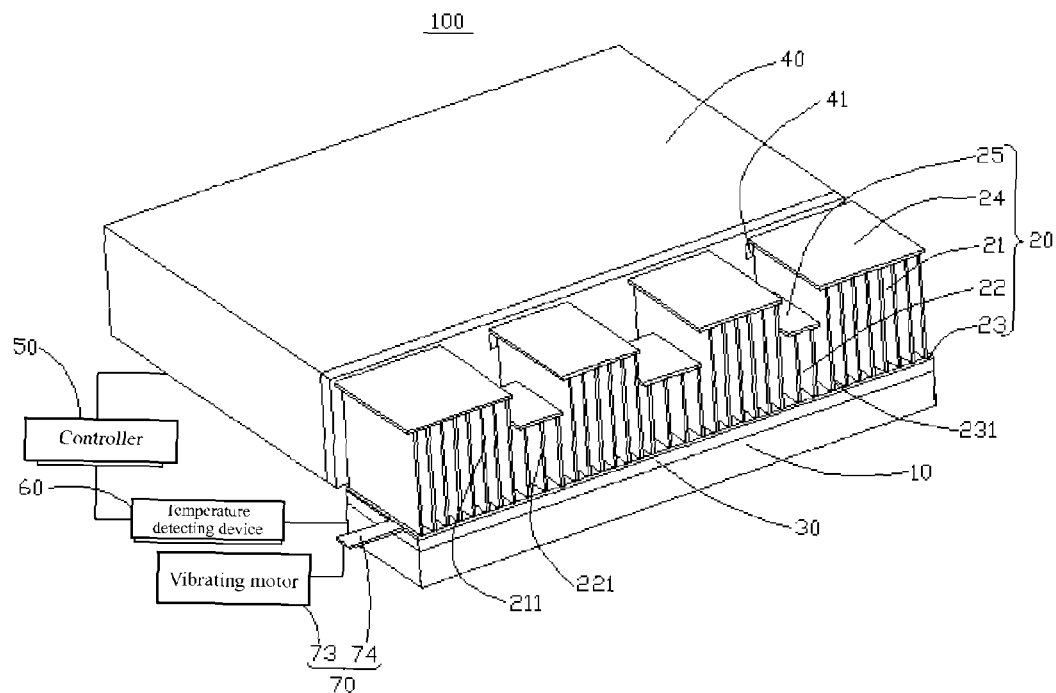
FIG. 10 is a structural schematic diagram of an electronic apparatus according to another preferred implementation mode of the present application.

As shown in FIG. 10, the drive section 70 may include a vibrating motor 73 and a leaf spring 74 connected with the vibrating motor 73. The heat dissipating device 20 is fixed onto the leaf spring 74. The vibrating motor 73 is used for driving the leaf spring 74 to vibrate, so as to drive the heat dissipating device 20 to vibrate.

The vibrating motor 73 is an excitation source which integrates a power source and a vibration source as one. A set of adjustable eccentric blocks is installed at each end of a rotor shaft, and an excitation force of the vibrating motor 73 is obtained by using a centrifugal force generated by high-speed rotation of the shaft and the eccentric block. The vibrating motor 73 is of high utilization of the excitation force, low energy consumption, low noise and long service life.

By setting the vibrating motor 73 and the leaf spring 74 which is connected with the vibrating motor 73 and is fixedly connected with the heat dissipating device 20, when the vibrating motor 73 is started, the vibrating motor 73 drives the leaf spring 74 to vibrate, so as to drive the heat dissipating device 20 to vibrate. Accordingly, the ambient air flow rate is accelerated, thus increasing the heat exchange rate between the heat dissipating device 20 and the ambient air, so as to enhance the heat dissipating rate.

Since the height of the first group of heat dissipating fins 21 which are on the heat dissipating device 20 of the electronic apparatus 100 and can be covered by the airflow blew out of the air outlet of the airflow acceleration device 40 with respect to the base plate 23 is set to be greater than the height of the second group of heat dissipating fins 22 with respect to the base plate 23, it can avoid the second group of heat dissipating fins 22 being in contact with the shell of the electronic apparatus 100, thus reducing the temperature of the shell of the electronic apparatus. In the meantime, heat dissipation is carried out timely through the first group of heat dissipating fins 21. The technical problem in the prior art as follows is solved, i.e. because the plurality of heat dissipating fins of the heat dissipating device are same in height, and part of the regions on the heat dissipating device can be covered by the airflow blew out from the air outlet of the airflow acceleration device, a dissipation rate in the regions of the heat dissipating device not covered by the airflow blew out of the air outlet of the airflow acceleration device is relatively slow during heat dissipation of the heating device, which renders a relatively high temperature of the shell of the electronic apparatus in contact with the regions, affecting the user's usage experience. The technical effects of reducing the temperature of the shell of the electronic apparatus and improving the user's usage experience are achieved.

By setting the first cover 24 at ends of the plurality of first heat dissipating fins 211 far away from the base plate 23 and setting the second cover 25 at ends of the plurality of second heat dissipating fins 221 far away from the base plate 23, a heat dissipating area of the heat dissipating device 20 is increased so as to promote the heat dissipating efficiency.

By setting the drive section 70 for driving the heat dissipating device 20 to vibrate, the ambient air flow rate is accelerated, thus increasing a heat exchange rate and a heat dissipating rate between the heat dissipating device and the ambient air. Accordingly, the technical problem in the prior art as follows is solved, i.e. the heat generated by the heating device cannot be timely conducted, resulting in a relatively high temperature of the heating device and affecting operation of the heating device. The technical effect of improving the heat dissipating efficiency of the electronic apparatus is achieved.

By setting the oscillation circuit 71 and the piezoelectric ceramic 72 which is connected with the oscillation circuit 71 and is fixedly connected with the heat dissipating device 20, when a current passes through the oscillation circuit 71, the oscillation circuit 71 will generate an oscillation current, and the piezoelectric ceramic 72 will vibrate upon excitation of the oscillation current, so as to drive the heat dissipating device 20 to vibrate. Accordingly, the ambient air flow rate is accelerated, and the heat exchange rate between the heat dissipating device 20 and the ambient air is increased, so as to enhance the heat dissipating rate.

By setting the vibrating motor 73 and the leaf spring 74 which is connected with the vibrating motor 73 and is fixedly connected with the heat dissipating device 20, when the vibrating motor 73 is started, the vibrating motor 73 drives the leaf spring 74 to vibrate, so as to drive the heat dissipating device 20 to vibrate to accelerate the ambient air flow rate. Accordingly, the heat exchange rate between the heat dissipating device 20 and the ambient air is increased, so as to enhance the heat dissipating rate.

Figure 11:
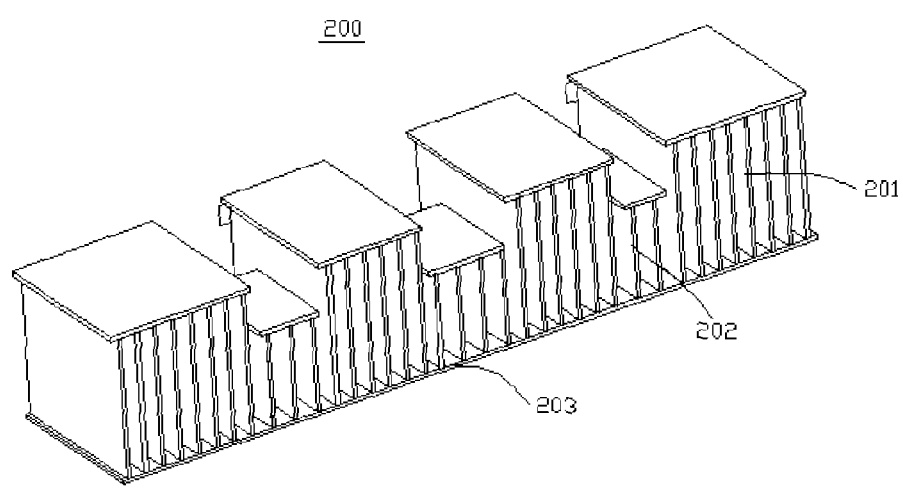
FIG. 11 is a structural schematic diagram of an electronic apparatus according to still another preferred implementation mode of the present application.

Based on the same inventive concept, the present application also provides a heat dissipating device 200. As shown in FIG. 11, it is a structural schematic diagram of a heat dissipating device 200 according to another preferred implementation mode of the present application. The heat dissipating device 200 is made of a heat-conducting material.

The heat dissipating device 200 comprises a base plate 203, a plurality of first heat dissipating fins 201 and a plurality of second heat dissipating fins 202. The plurality of first heat dissipating fins 201 and the plurality of second heat dissipating fins 202 are disposed in parallel on a surface of the base plate 203. A height of the plurality of first heat dissipating fins 201 with respect to the base plate 203 is greater than a height of the plurality of second heat dissipating fins 202 with respect to the base plate 203. And heights of respective first heat dissipating fins in the plurality of first heat dissipating fins 211 may be same or different; likewise, heights of respective second heat dissipating fins in the plurality of second heat dissipating fins 221 may be same or different.

Specifically, a gap between two adjacent first heat dissipating fins 201 among the plurality of first heat dissipating fins 201 is less a gap between two adjacent second heat dissipating fins 202 among the plurality of second heat dissipating fins 202.

By setting the height of the first group of heat dissipating fins 21 on the heat dissipating device 200 with respect to the base plate 23 to be greater than the height of the second group of heat dissipating fins 22 of the heat dissipating device 200, the height of the second group of heat dissipating fins 22 is reduced, so it can avoid the second group of heat dissipating fins 22 being in contact with the shell of the electronic apparatus. Accordingly, the temperature of the shell of the electronic apparatus can be reduced, and thus the technical problem in the prior art as follows is solved, i.e. because the plurality of heat dissipating fins of the heat dissipating device are same in height, and part of the regions on the heat dissipating device can be covered by the airflow blew out from the air outlet of the airflow acceleration device, a dissipation rate in the regions not covered by the airflow blew out from the air outlet of the airflow acceleration device of the heat dissipating device is relatively slow during heat dissipation of the heating device, which renders a relatively high temperature of the shell of the electronic apparatus in contact with the regions, the user's usage experience is affected. The technical effects of reducing the temperature of the shell of the electronic apparatus and improving the user's usage experience are achieved.

It should be noted that, in the present specification, the term "comprising", "including" or any other variation thereof are intended to cover a non-exclusive inclusion, such that a process, a method, an article or a device including a series of elements not only includes these elements, but also include other elements that are not explicitly listed, or further include inherent elements of such process, method, article or device. In the case where there is no more limitation, an element defined by a phase "comprising . . . " does not exclude a fact that the process, the method, the article, or the device including the above elements also has other identical elements.

Although the present application has been described in detail above, the principles and embodiments of the present application have been described by using specific examples herein, yet description of the above embodiments is only used to help understand the method of the present application and core concept thereof, and the advantages and improvements thereof are obvious for a person of ordinary skill in the art. Therefore, the present application in its broader aspects is not limited to the specific details and exemplary embodiments described herein, and based on the concept of the present application; specific implementation modes and application scope may change. Therefore, various improvements may be made to the present application without departing from the spirit and scope of the general inventive concept defined by the attached claims and their equivalents. In summary, the disclosure of the present specification shall not be construed as a limitation to the present application.

The invention claimed is:

1. A heat dissipating device comprising plurality of horizontal heat dissipating fins being horizontally arranged in parallel with each other in a stacked manner, such that arrangement of the plurality of horizontal heat dissipating fins is consistent with an airflow direction of an air outlet of a fan abutting a first side of the heat dissipating device, wherein two adjacent horizontal heat dissipating fins have a gap there between, through which air from the air outlet of the fan is discharged, wherein a first horizontal heat dissipating fin is located at an uppermost layer among the plurality of horizontal heat dissipating fins is coupled with a heat pipe, the plurality of horizontal heat dissipating fins extends to a vertical direction on a second side of the heat dissipating device and is closed connected with each other.

2. The heat dissipating device according to claim 1, further comprising a plurality of vertical heat dissipating fins located at a second side of the heat dissipating device and configured to couple the plurality of horizontal heat dissipating fins with each other, the plurality of vertical heat dissipating fins conducting heat from the first horizontal heat dissipating fin to other horizontal heat dissipating fins.

3. The heat dissipating device according to claim 1, further comprising a plurality of vertical heat-conducting sections located in the gap between two adjacent horizontal heat dissipating fins among the plurality of horizontal heat dissipating fins, at least one of the vertical heat-conducting sections being coupled with two adjacent horizontal heat dissipating fins to conduct heat between the two adjacent horizontal heat dissipating fins.

4. The heat dissipating device according to claim 1, wherein the heat pipe extends to the second side of the heat dissipating device.

5. The heat dissipating device according to claim 1, wherein the horizontal heat dissipating fins have at least one aperture adjacent to the air inlet of the fan, wherein a diameter of the aperture is less than 1 mm.

6. The heat dissipating device according to claim 1, wherein the fan is a vibrating diaphragm fan comprising:
a vibrating diaphragm fan body including a vibrating diaphragm and a shell supporting the vibrating diaphragm, the shell being provided with an aperture for air inlet and/or air outlet; and
a damping bracket supporting the vibrating diaphragm fan body on an electronic apparatus.

7. The heat dissipating device according to claim 6, wherein the damping bracket is at least one corrugated edge fold extending from a shell edge to an exterior of the shell and being bent.

8. The heat dissipating device according to claim 7, wherein a damping material is set at an end of one corrugated edge fold farthest from the shell edge along the extending direction so that the end of the corrugated edge fold is connected with the electronic apparatus in a damping manner.

9. An electronic apparatus that includes a heat dissipating device that comprises a plurality of horizontal heat dissipating fins being horizontally arranged in parallel with each other in a stacked manner, such that arrangement of the plurality of horizontal heat dissipating fins is consistent with an airflow direction of an air outlet of the a fan abutting a first side of the heat dissipating device, wherein two adjacent horizontal heat dissipating fins have a gap there between, through which air from the outlet of the fan is discharged, wherein a first horizontal heat dissipating fin is located at an uppermost layer among the plurality of horizontal heat dissipating fins and is coupled with a heat pipe, the plurality of horizontal heat dissipating fins extends to a vertical direction on a second side of the heat dissipating device and is closed connected with each other.

10. The electronic apparatus according to claim 9, wherein the heat dissipating device further comprises a plurality of vertical heat dissipating fins located at a second side of the heat dissipating device and configured to couple the plurality of horizontal heat dissipating fins with each other, the plurality of vertical heat dissipating fins conducting heat from the first horizontal heat dissipating fin to other horizontal heat dissipating fins.

11. The electronic apparatus according to claim 9, wherein the heat dissipating device further comprises a plurality of vertical heat-conducting sections located in the gap between two adjacent horizontal heat dissipating fins among the plurality of horizontal heat dissipating fins, the vertical heat-conducting section being coupled with two adjacent horizontal heat dissipating fins to conduct heat between the two adjacent horizontal heat dissipating fins.

12. The electronic apparatus according to claim 9, wherein the heat pipe extends to the second side of the heat dissipating device.

13. An electronic apparatus, comprising:
- at least one heating electronic device;
- a heat dissipating device made of a heat conducting material and including a base plate, a first group of heat dissipating fins and a second group of heat dissipating fins, the first group of heat dissipating fins and the second group of heat dissipating fins being disposed on a first surface of the base plate;
- a conducting section disposed between the electronic device and the heat dissipating device for conducting heat generated by the electronic device to the heat dissipating device for dissipation;
- an airflow acceleration device, wherein airflow blown out of an air outlet of the airflow acceleration device covering the first group of heat dissipating fins;
- wherein, a height of the first group of heat dissipating fins with respect to the base plate is greater than a height of the second group of heat dissipating fins with respect to the base plate.

14. The electronic apparatus according to claim 13, wherein the first group of heat dissipating fins include a plurality of first heat dissipating fins disposed in parallel on the first surface, and the second group of heat dissipating fins includes a plurality of second heat dissipating fins disposed in parallel on the first surface, a gap between two adjacent first heat dissipating fins among the plurality of first heat dissipating fins is less than a gap between two adjacent second heat dissipating fins among the plurality of second heat dissipating fins.

15. The electronic apparatus according to claim 13, wherein the heat dissipating device further includes a first cover and a second cover, the first cover is fixedly connected with ends of the plurality of first heat dissipating fins far away from the base plate, and the second cover is fixedly connected with ends of the plurality of second heat dissipating fins far away from the base plate.

16. The electronic apparatus according to claim 13, wherein the airflow acceleration device is a vibrating diaphragm fan that comprises:
- a vibrating diaphragm fan body including a vibrating diaphragm and a shell supporting the vibrating diaphragm, with the shell being provided with an aperture for air inlet and/or an air outlet;
- a damping bracket for reducing an effect of vibration of the vibrating diaphragm fan on an electronic apparatus, the damping bracket supporting the vibrating diaphragm fan body on the electronic apparatus, while the vibrating diaphragm fan body is not in direct contact with the electronic apparatus.

17. The electronic apparatus according to claim 13, wherein the electronic apparatus further comprises a controller and a temperature detecting device, the temperature detecting device being used for detecting temperature of the electronic device, and the controller being used for controlling an air source temperature or a flow rate or a rotation speed of the airflow acceleration device according to a detected temperature.

18. The electronic apparatus according to claim 13, wherein the electronic apparatus further comprises a drive section used for driving the heat dissipating device to vibrate.

19. The electronic apparatus according to claim 18, wherein the drive section includes an oscillation circuit and a piezoelectric ceramic connected with the oscillation circuit, wherein the heat dissipating device is fixed onto the piezoelectric ceramic and the piezoelectric ceramic vibrates when a current passes through the oscillation circuit, so as to drive the heat dissipating device to vibrate.

20. The electronic apparatus according to claim 18, wherein the drive section includes a vibrating motor and a leaf spring connected with the vibrating motor, wherein the heat dissipating device is fixed onto the leaf spring, and the vibrating motor is used for driving the leaf spring to vibrate, so as to drive the heat dissipating device to vibrate.

\* \* \* \* \*